United States Patent [19]
Fenlon et al.

[11] Patent Number: 5,250,870
[45] Date of Patent: Oct. 5, 1993

[54] ULTRA-THIN SURFACE MOUNT CRYSTAL PACKAGE

[75] Inventors: Paul F. Fenlon, Elmwood Park; Thomas A. Knecht, Crystal Lake; Robert S. Witte, Algonquin; William G. Skoda, Oak Park; R. Victor Thompson, Palatine, all of Ill.

[73] Assignee: Motorola, Inc., Schaumburg, Ill.

[21] Appl. No.: 857,349

[22] Filed: Mar. 25, 1992

[51] Int. Cl.⁵ .............................................. H01L 41/08
[52] U.S. Cl. .................................... 310/345; 310/352
[58] Field of Search ............... 310/334, 344, 345, 348, 310/352, 367, 369

[56] References Cited

U.S. PATENT DOCUMENTS

| | | | |
|---|---|---|---|
| 3,622,816 | 11/1971 | McGrew | 310/369 |
| 3,979,614 | 9/1976 | Toyoda | 310/367 |
| 4,135,108 | 1/1979 | Besson | 310/344 |
| 4,651,310 | 3/1987 | Kaneko et al. | 367/140 |
| 4,703,218 | 10/1987 | Takahashi et al. | 310/348 |
| 5,030,875 | 7/1991 | Knecht | 310/346 |

Primary Examiner—Steven L. Stephan
Assistant Examiner—D. R. Haszko
Attorney, Agent, or Firm—Joseph P. Krause

[57] ABSTRACT

An ultra thin piezoelectric quartz crystal package can be realized by using adhesive dollops to compliantly mount a piezoelectric device within a thin package. The adhesive dollops maintain spacing between the upper and lower surfaces of the piezoelectric device (18) and the surfaces (13 and 15) of the housing that is comprised of upper and lower substrates (12 and 14).

24 Claims, 1 Drawing Sheet

ULTRA-THIN SURFACE MOUNT CRYSTAL PACKAGE

FIELD OF THE INVENTION

This invention relates to piezoelectric devices. More particularly, this invention relates to surface mount crystal packages.

BACKGROUND OF THE INVENTION

It is well known that the physical size of radio communications devices such as pagers and cellular telephones continues to decrease. Some recently introduced pagers are only slightly thicker than commonly available credit cards, an achievement attributable in part to the recent advent of so called surface-mount manufacturing technology.

Further reductions in the physical size and specifically the height of such communications devices will be limited by the height of the components that they are comprised of. In particular, if these radio communications devices are to be of conventional circuit designs, employing for example local oscillators that use quartz crystal devices for frequency control, the crystal packages will have to be substantially reduced in their thickness.

A problem with mounting small quartz crystals in thin packages is the maintenance of a clearance between the vibrating piezoelectric element and its housing. The piezo or quartz crystal element must include metallized electrodes and be compliantly mounted in such a way that the piezoelectric element can vibrate without being mechanically shocked or having its vibration damped by a mounting structure.

Various prior art mounting schemes for piezoelectric devices include the use of various resilient materials and bent or folded metallic tabs that cushion the piezoelectric device from shock and provide some conductive path between external circuitry for the device and the electrodes on the piezoelectric devices surfaces. A problem with these prior art mounting structures is their inability to maintain extremely close clearances, on the order of 0.005" or less between the surfaces of the piezoelectric device and its housing. In such a small housing, it is indeed often impossible to compliantly mount a very small quartz device using these prior art mounting structures in such a way that there is no risk that the vibrating quarts element will come in contact with its surroundings.

A quartz crystal package that provides an ultra thin external height dimension of 0.050 inches or less in thickness that compliantly mounts a piezoelectric element within an even smaller cavity would be an improvement over the prior art.

SUMMARY OF THE INVENTION

There is provided an ultra thin quartz crystal package comprised of a housing that encloses a small cavity. A piezoelectric element is mounted within the cavity using compliant adhesive mounting dollops on both the upper and lower surfaces of the piezoelectric element. The dollops, which are applied to the piezoelectric element at predetermined locations, such as vibratory nodes, prevent the piezoelectric element from contacting the surfaces of the housing which encloses the piezoelectric element.

DESCRIPTION OF A PREFERRED EMBODIMENT

Figure 1:
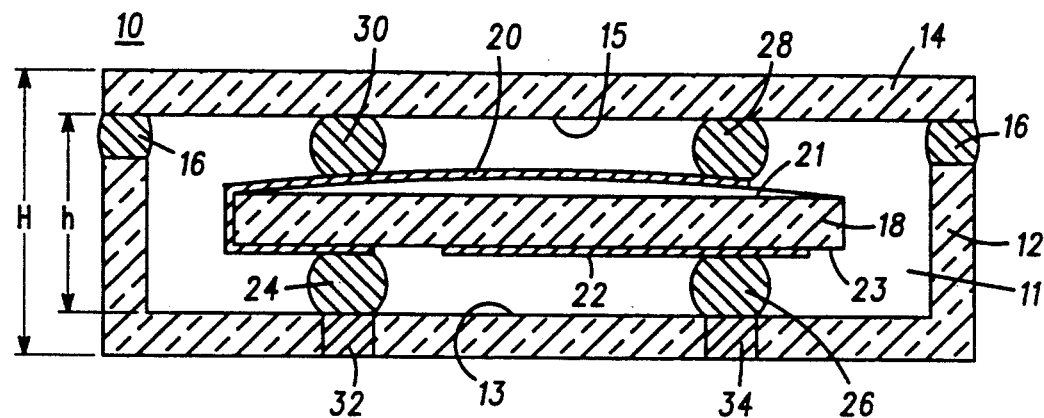
FIG. 1 shows a cross-sectional view of one embodiment of an ultra thin piezoelectric package.

FIG. 1 shows an ultra thin quartz crystal package (10). This package is comprised of a housing that encloses a cavity (11). The housing is comprised of a lower substrate (12) having at least one substantially planar surface (13), an upper substrate (14), and also has a planar surface (15) as shown. The upper substrate (14) is mechanically coupled to the lower substrate (12) by an adhesive joint (16) that may typically be either a solder seal or other appropriate seal that can maintain the coupling between the upper substrate (14) and the lower substrate (12) consistent with the requirement that the package height (H) be minimized.

A piezoelectric element (18) which in the preferred embodiment is quartz, but which also might include crystals or piezoelectric elements comprised of lithium niobate, lithium tantalate, lithium tetraborate, and/or aluminum phosphate for example, are compressively mounted in the cavity (11) by adhesive dollops (24, 26, 28, and 30) that compliantly fix the piezoelectric element in place and ensure that neither the upper surface of the piezoelectric element (21) nor the lower surface of the piezoelectric element (23) contacts the inner surfaces of the housing that encloses the cavity (11).

The piezoelectric element (18) shown in FIG. 1, which in the preferred embodiment is an AT-cut crystal, has a substantially convex upper surface and a substantially planar lower surface (21 and 23 respectively). The piezoelectric element (18), of course, includes upper and lower electrodes (20 and 22) which are used to apply an electrical signal to the piezoelectric element in accordance with well known crystal oscillator techniques. Those skilled in the art will recognize that in addition to having one surface being convex and the other planar, the piezoelectric element (18) could also have both the upper and lower surfaces be convex; both could be planar.

In the embodiment shown, the piezoelectric element (18) has its upper electrode (20) connected to one adhesive dollop (24) that is located between the lower surface of the piezoelectric element (23) and the inner surface (13) of the lower substrate (12). Electrical signals are carried to this upper electrode (20) through a conductive via (32) (which is typically filled with any appropriate conductive material such as tungsten for example) through the compliant adhesive mounting dollop (24) (which is also an electrically conductive material) to a wrap around conductive trace (21) that follows the contour of the piezoelectric element from the lower surface of the piezoelectric element (23) around its perimeter to its upper surface (21) to the upper electrode (20). Electrical signals are carried to the lower electrode (22) of the piezoelectric element (18) through another conductive via (34) by means of another conductive and compliant adhesive mounting dollop (26).

As shown in FIG. 1, there is at least one compliant adhesive mounting dollop coupled to the inner surface (13) of the lower substrate (12) and to the lower surface (23) of the piezoelectric element. The mounting dollops shown (24 and 26) in the preferred embodiment are comprised of electrically conductive silicone adhesive dollops and maintain the piezoelectric element (18) above the surface identified by reference numeral 13. Other compliant adhesive mounting dollops (28 and 30) that are coupled to the inner surface (15) of the upper substrate (14) and the upper surface (21) of the piezoelectric element (18) maintain a distance or spacing between the upper surface of the piezoelectric element and the upper surface of the inner surface (15) of the upper substrate (14). The combination of these mounting dollops (24, 26, 28, and 30) compressively fix the piezoelectric element (18) and its included electrodes (20 and 22) within the cavity (11) in such a way that the vibrating of piezoelectric element (18) has its vibrations isolated from the stationery surfaces of the housing within a very small height dimension (h). In the preferred embodiment, the piezoelectric element (18) was a 75 MHz. third overtone AT strip resonator mounted at its corners within a housing having an interior height dimension (h) less than 0.020".

In the preferred embodiment the lower substrate, which as is shown in FIG. 1 is somewhat bathtub shaped, was a nonconductive material. Such materials might include alumina, glass, or any ceramic for example.

The upper substrate (14) in the preferred embodiment is also preferably a nonconductive material but if the upper adhesive dollops (28 and 30) are themselves nonconductive silicone adhesive, the upper substrate (14) itself might include an electrically conductive material such as copper, stainless steel, or nickel for example. By appropriate use of nonconductive dollops (24 and 26), the lower substrate (12) itself might be made of metal in which case the upper surface (14) might have to be comprised of a nonconductive material as well. (Those skilled in the art will realize that the appropriate use of conductive and nonconductive silicone adhesive will permit the use of either conductive lower substrates (12) or conductive upper substrates (14).)

Figure 2:
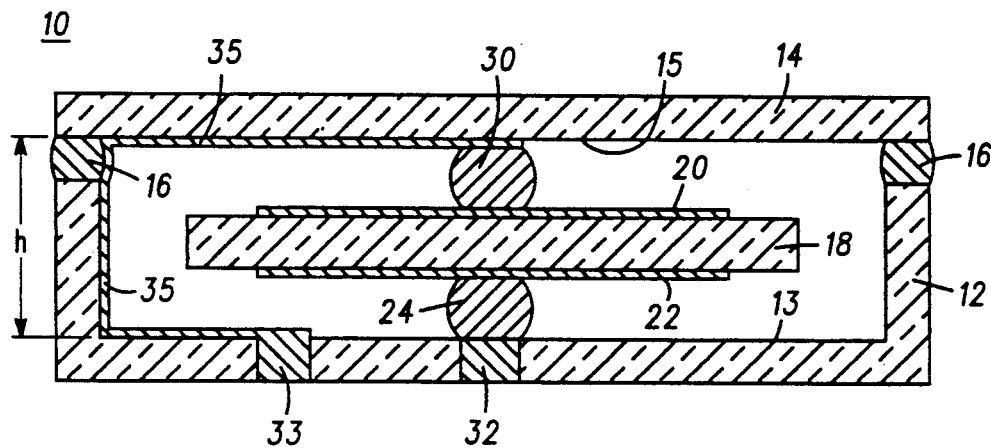
FIG. 2 shows an alternate embodiment of an ultra thin piezoelectric package.

FIG. 2 shows a cross-sectional view of an alternate embodiment of the ultra thin quartz crystal package (10). In FIG. 2 the compliant adhesive mounting dollops (24 and 30) are depicted in the approximate geometric center of the piezoelectric element (18) which itself has upper and lower planar surfaces. In such an embodiment, the piezoelectric element (18) might be a GT-cut quartz crystal, which as well known in the art has vibration nodes at its approximate geometric center. By using only two dollops in the housing, such as is shown in FIG. 2, a crystal resonator can be mounted in a cantilever fashion. In this sense the area of the quartz extending outward from the dollops shown in FIG. 2 is cantilevered from the dollops. Electrical signals are carried to the upper electrode (20) by means of the first compliant adhesive dollop (30), which is electrically conductive, to a conductive layer or trace (35) coupled to the inner surface (15) of the upper substrate (14). This conductive trace (35) follows the inside surface of the housing eventually ending at a conductive via (33) that extends through the lower substrate (12) thereby providing an external connection for signals to be applied to the upper electrode (20). Electrical connection to the lower electrode (22) is had through another conductive via (32) and the lower or second conductive, compliant adhesive dollop (24).

Those skilled in the art will recognize that if a GT-cut crystal is not used in the embodiment shown in FIG. 2, and if instead another crystal cut such as an AT strip resonator is selected for the resonator (18), a plurality of mounting dollops as shown in FIG. 1 might have to be employed to mount the piezoelectric device (18) within the cavity. An AT-cut crystal typically requires the adhesive dollops to be located at the edge or corners of an AT-cut strip where their effect on the vibration of the quartz is minimized.

A critical element in the enablement of the invention disclosed herein is the use of a compliant and conductive silicone adhesive. The adhesive used in the preferred embodiment is available from Emerson and Cuming, Inc., 77 Dragon Court, Woolburn, Mass. 01888. Their Emerson Cumming product number LE-3355-35 was used for the dollops.

Those skilled in the art will realize that the adhesive dollops which comprise a mounting means for compressively mounting the piezoelectric element between the upper and lower substrates, as shown in FIGS. 1 and 2 permits the piezoelectric elements (18) to be compliantly mounted within the housing with a minimum amount of spacing wasted. An ultra thin quartz crystal package that can be used in such thin radio devices as a credit card radio therefore becomes possible.

Figure 3:
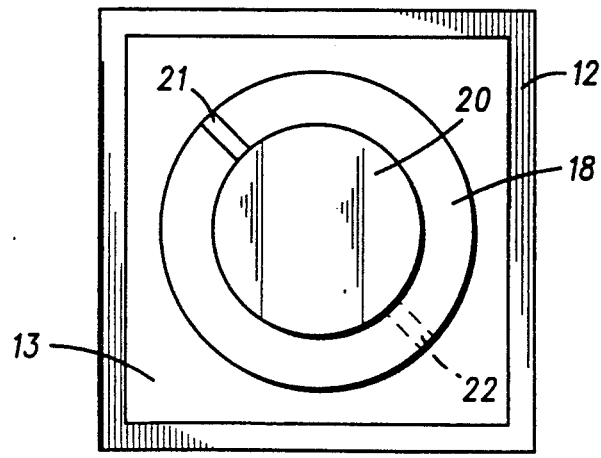
FIG. 3 shows a plan view of the packages shown in FIGS. 1 and 2 albeit with the cover of the package removed and showing the relative placement of the piezoelectric device within the housing.

FIG. 3 shows a plan view of the ultra thin quartz crystal package with the upper substrate or cover (14) removed. It can be seen at a lower substrate (12) and its substantially planar inner surface (13) houses the piezoelectric element (18) which as is shown in FIG. 3 has a substantially planar thin metallic upper electrode (20). Electrical signals are passed to this upper electrode (20) through the lead-in trace (21). The lower electrode is not shown in this drawing but the lead-in trace for the lower electrode is shown in broken lines and identified by reference numeral (22).

In the preferred embodiment when the piezoelectric element (18) is as is shown in FIG. 1, the interior height dimension (h) was less than 0.020". When using a piezoelectric element (18) with at least one convex surface (where the piezoelectric device (18) has upper and lower convex surfaces) the interior height dimension (h) was less than 0.025". Overall package height (H) was less than 0.050".

In prior art crystal mounting structures, mounting a piezoelectric device such as a quartz crystal directly to a substrate with a stiff or non-compliant adhesive, such as conductive epoxy resin, can create stress in the quartz as the temperature of the quartz and substrate change. Such temperature-induced stress can change the absolute frequency of a crystal, as well as its temperature-frequency characteristics, usually in an undesirable way. Using the compliant adhesive mounting dollops on both sides of the quartz significantly reduces thermal stresses on the quartz and permits the quartz to be securely mounted in an ultra-thin package.

What is claimed is:

1. A thin quartz crystal package comprised of:
   a housing enclosing a cavity, said housing comprised of:
   a lower substrate having at least one substantially planar inner surface;
   an upper substrate having at least one substantially planar inner surface;

a piezoelectric element, within said cavity, having upper and lower surfaces;

a first compliant, adhesive mounting dollop coupled to the inner surface of said lower substrate and the lower surface of said piezoelectric element; and a second compliant, adhesive mounting dollop coupled to the inner surface of said upper substrate and the upper surface of said piezoelectric element.

2. The apparatus of claim 1 where at least one of said first and second compliant adhesive dollops are comprised of electrically conductive silicone adhesive.

3. The apparatus of claim 1 where said upper and lower substrates enclose a volume when they are coupled together, said volume having an interior height dimension less than 0.020 inches.

4. The apparatus of claim 1 where said piezoelectric element includes upper and lower electrodes coupled to said upper and lower surfaces respectively.

5. The apparatus of claim 1 where said upper and lower surfaces of said piezoelectric element are substantially planar.

6. The apparatus of claim 1 where at least one of said upper and lower surfaces of said piezoelectric element is substantially convex.

7. The apparatus of claim 6 where said upper and lower substrates enclose a volume when they are coupled together, said volume having an interior height dimension less than 0.030 inches.

8. The apparatus of claim 1 where at least one of said upper and lower substrates is comprised of alumina.

9. The apparatus of claim 1 where at least one of said upper and lower substrates is comprised of metal.

10. The apparatus of claim 1 where said upper and lower substrates are comprised of electrically conductive material and said first and second compliant adhesive mounting dollops are electrically insulative.

11. A thin quartz crystal package comprised of:
a lower substrate having at least one substantially planar inner surface;
an upper substrate having at least one substantially planar inner surface;
a piezoelectric element having upper and lower surfaces and upper and lower electrodes coupled to said upper and lower surfaces respectively;
a first compliant, electrically conductive, adhesive mounting dollop coupled between the lower electrode and the inner surface of said lower substrate; and
a second compliant, electrically conductive, adhesive mounting dollop coupled between the upper electrode and the inner surface of said upper substrate.

12. The apparatus of claim 11 where said first and second compliant adhesive dollops are comprised of silver filled silicone adhesive.

13. The apparatus of claim 11 where said upper and lower substrates enclose a volume when they are coupled together, said volume having an interior height dimension less than 0.020 inches.

14. The apparatus of claim 11 where said upper and lower surfaces of said piezoelectric element are substantially planar.

15. The apparatus of claim 11 where at least one of said upper and lower surfaces of said piezoelectric element is substantially convex.

16. The apparatus of claim 15 where said upper and lower substrates enclose a volume when they are coupled together, said volume having an interior height dimension less than 0.030 inches.

17. A thin quartz crystal package comprised of:
a housing comprised of:
a lower substrate having at least one substantially planar inner surface and an upper substrate having at least one substantially planar inner surface, said lower and upper substrates enclosing a volume when they are coupled together;
a piezoelectric element within said volume, said element having upper and lower surfaces and upper and lower electrodes coupled to said upper and lower surfaces respectively;
a first compliant, electrically conductive, adhesive mounting dollop coupled between the lower electrode and the inner surface of said lower substrate; and
a second compliant, electrically conductive, adhesive mounting dollop coupled between the upper electrode and the inner surface of said upper substrate.

18. The apparatus of claim 17 where said first and second compliant adhesive dollops are comprised of silver filled silicone adhesive.

19. The apparatus of claim 17 where said upper and lower substrates enclose a volume when they are coupled together, said volume having an interior height dimension less than 0.020 inches.

20. The apparatus of claim 17 where said upper and lower surfaces of said piezoelectric element are substantially planar.

21. The apparatus of 17 where at least one of said upper and lower surfaces of said piezoelectric element is substantially convex.

22. The apparatus of claim 21 where said upper and lower substrates enclose a volume when they are coupled together, said volume having an interior height dimension less than 0.030 inches.

23. A thin quartz crystal package comprised of:
a housing comprised of:
a lower substrate having at least one substantially planar inner surface and an upper substrate having at least one substantially planar inner surface, said lower and upper substrates enclosing a volume when they are coupled together;
a piezoelectric element within said volume, said element having upper and lower surfaces and upper and lower electrodes coupled to said upper and lower surfaces respectively;
a plurality of compliant, electrically conductive, adhesive mounting dollops coupled between the lower electrode and the inner surface of said lower substrate; and
a plurality of compliant, electrically conductive, adhesive mounting dollops coupled between the upper electrode and the inner surface of said upper substrate.

24. A thin quartz crystal package comprised of:
a housing comprised of:
a lower substrate having at least one substantially planar inner surface and an upper substrate having at least one substantially planar inner surface, said lower and upper substrates enclosing a volume when they are coupled together;
a piezoelectric element within said volume, said element having upper and lower surfaces and upper and lower electrodes coupled to said upper and lower surfaces respectively;
a plurality of compliant, electrically conductive, adhesive mounting dollops coupled between the lower electrode and the inner surface of said lower substrate; and
a plurality of compliant, adhesive mounting dollops coupled between the upper electrode and the inner surface of said upper substrate.

* * * * *